(12) United States Patent
Thizon et al.

(10) Patent No.: US 8,969,740 B2
(45) Date of Patent: Mar. 3, 2015

(54) ELECTRIC CONTROL OR SIGNALING DEVICE

(75) Inventors: Patrice Thizon, Ruelle sur Touvre (FR); Eric Bardy, Linars (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 42 days.

(21) Appl. No.: 13/982,013

(22) PCT Filed: Jan. 19, 2012

(86) PCT No.: PCT/EP2012/050751
§ 371 (c)(1),
(2), (4) Date: Jul. 26, 2013

(87) PCT Pub. No.: WO2012/110274
PCT Pub. Date: Aug. 23, 2012

(65) Prior Publication Data
US 2013/0306366 A1 Nov. 21, 2013

(30) Foreign Application Priority Data
Feb. 16, 2011 (FR) ...................... 11 51275

(51) Int. Cl.
*H02G 7/00* (2006.01)
*H05K 7/00* (2006.01)
*H02B 1/044* (2006.01)

(52) U.S. Cl.
CPC . *H05K 7/00* (2013.01); *H02B 1/044* (2013.01)
USPC ........... 174/650; 174/480; 174/151; 174/651; 174/665; 439/302; 439/544; 439/572

(58) Field of Classification Search
USPC ......... 174/480, 481, 503, 520, 650, 651, 652, 174/659, 663, 668, 669, 68.1, 50, 655, 561, 174/151, 21 R; 439/535, 302, 306, 321, 339, 439/374, 544, 545, 550, 551, 572; 200/296, 200/237, 293
See application file for complete search history.

(56) References Cited

U.S. PATENT DOCUMENTS 4,191,872 A * 3/1980 Sorenson ...................... 200/296
4,293,151 A * 10/1981 Manzel .......................... 174/665
(Continued)

FOREIGN PATENT DOCUMENTS

DE 196 36 706 C1 1/1998
DE 103 30 853 A1 2/2005
(Continued)

OTHER PUBLICATIONS

International Search Report issued Feb. 23, 2012 in PCT/EP2012/050751 with English language translation.
(Continued)

*Primary Examiner* — Angel R Estrada
(74) *Attorney, Agent, or Firm* — Oblon, McClelland, Maier & Neustadt, L.L.P.

(57) ABSTRACT

An electric control or signaling device to be assembled through an opening formed in a wall, and including a tubular metal body which is to engage with a first surface of the wall, wherein the body includes a threaded cylindrical portion to be inserted into the opening and an attachment device including a metal clamping ring to be screwed onto the threaded cylindrical portion of the body to attach the control or signaling device through the opening, and a metal attachment plate to be applied against a second surface of the wall opposite the first surface by the clamping ring.

7 Claims, 4 Drawing Sheets

(56) References Cited

U.S. PATENT DOCUMENTS

Figure 1:
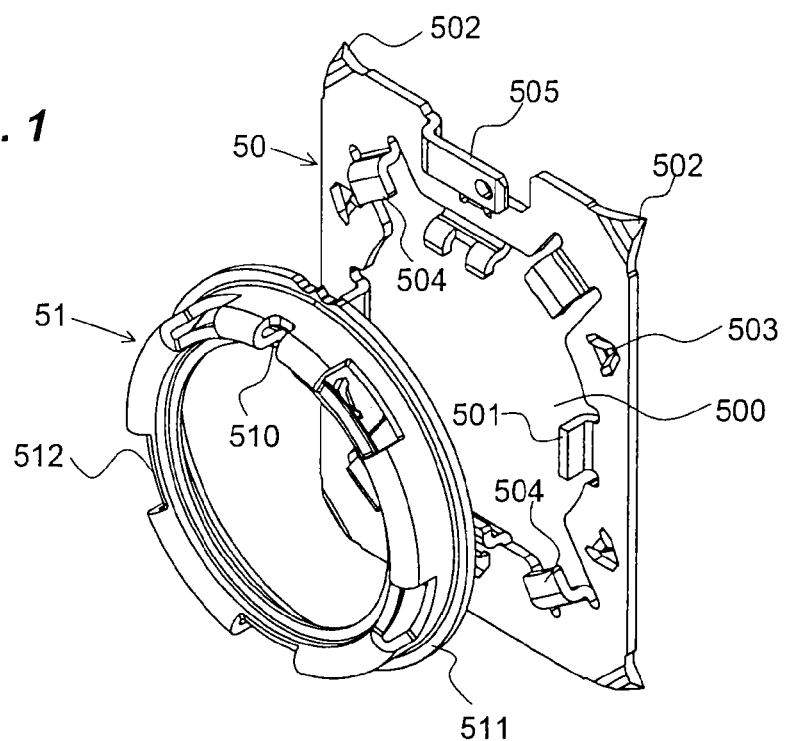

| | | | |
|---|---|---|---|
| 4,778,949 A * | 10/1988 | Esterle et al. | 174/151 |
| 5,035,640 A * | 7/1991 | Drogo | 439/321 |
| 5,072,072 A * | 12/1991 | Bawa et al. | 174/655 |
| 5,191,969 A | 3/1993 | Berger | |
| 5,929,383 A * | 7/1999 | Marik et al. | 174/78 |
| 6,123,578 A * | 9/2000 | Truett | 439/551 |
| 7,265,289 B2 * | 9/2007 | Roehm et al. | 174/50 |
| 7,977,584 B2 * | 7/2011 | Kameyama | 174/561 |
| 8,334,457 B2 * | 12/2012 | Garriga et al. | 174/21 R |

FOREIGN PATENT DOCUMENTS

| | | |
|---|---|---|
| EP | 0 326 808 A1 | 8/1989 |
| EP | 2 053 712 A1 | 4/2009 |
| GB | 778 625 A | 7/1957 |

OTHER PUBLICATIONS

International Preliminary Report on Patentability and English translation of the Written Opinion issued Aug. 21, 2013 in PCT/EP2012/050751.

* cited by examiner

ELECTRIC CONTROL OR SIGNALING DEVICE

The present invention relates to an electric control or signaling device of the pushbutton, rotary knob, indicator lamp type or of a like type having the same architecture. The invention concerns more particularly the fixing means of such an electric control or signaling device.

A known electric control or signaling device used in industry is intended to be assembled through an opening formed in a wall. It includes a tubular body that can be engaged in the opening in the wall and that, with the aid of locking means, can be mated with a base intended to receive at least one electric contact assembly and fixing means acting on the internal face of the wall to fix the device to the wall.

In the prior art, the fixing means employed comprise for example a nut screwed onto a thread of the tubular body of the device or, as described in European patent EP0452462 or EP0889564, a base that is assembled to the tubular body and carries contact assemblies, this base carrying attachment means such as grub screws or pivoted attachment arms maneuvered by means of a screw.

These fixing means are either too complex, and therefore too costly, or unsatisfactory because they cannot provide all the functions, such as grounding the device, for example.

The object of the invention is therefore to propose an electric control or signaling device including fixing means enabling the fixing function to be provided in a simple and relatively inexpensive manner and the grounding function to be provided without adding any dedicated member.

This object is achieved by an electric control or signaling device intended to be assembled through an opening formed in a wall and including a tubular metal body intended to come to bear against a first face of the wall, the body including a threaded cylindrical part intended to be engaged in the opening and a fixing device including a metal clamping ring adapted to be screwed onto the threaded cylindrical part of the body to fix the control or signal device through the opening, the fixing device also including a metal fixing plate intended to be applied against a second face of the wall, opposite the first face, by virtue of the action of the clamping ring, said fixing plate including an opening intended to have the body of the device pass through it and means for retaining the clamping ring enabling the clamping ring to be fastened to the fixing plate, said retaining means being adapted to prevent movement in translation of the clamping ring relative to the fixing plate and to leave the clamping ring free to rotate relative to the fixing plate.

In accordance with one feature, the fixing plate includes projecting points intended to come into contact with the second face of the wall.

In a variant embodiment, instead of projecting points, the fixing plate includes projecting teeth upstanding so as to come into contact with the wall and adapted to provide flush mounting of the control or signaling device in the opening.

In accordance with another feature, the retaining means include a plurality of clips distributed over the perimeter of the opening formed through the fixing plate.

In accordance with another feature, the fixing plate includes means for guiding the body of the control or signaling device.

In accordance with another feature, the cylindrical part of the body includes a lug intended to cooperate with a corresponding slot of the clamping ring.

In accordance with another feature, the fixing plate includes a connecting terminal adapted to be connected to a terminal connected to a ground wire.

Figure 2:
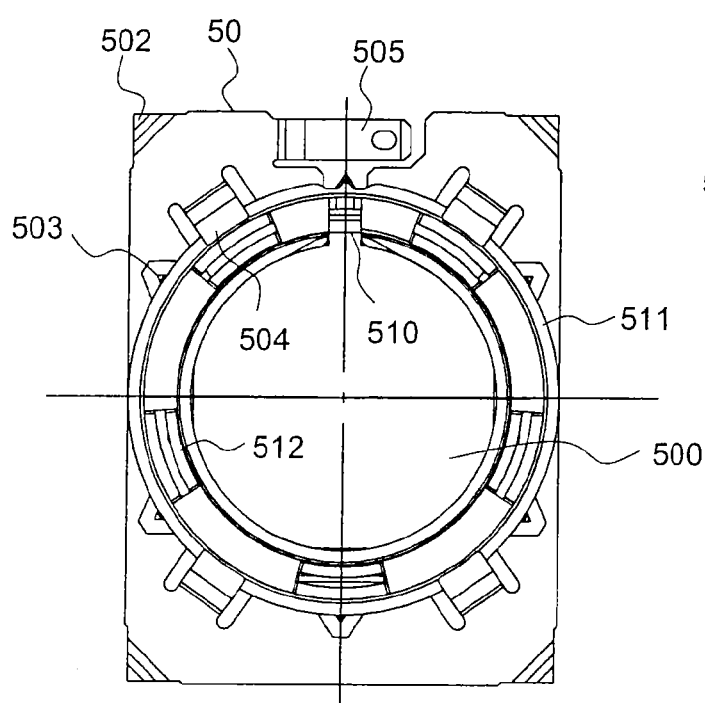
Figure 3:
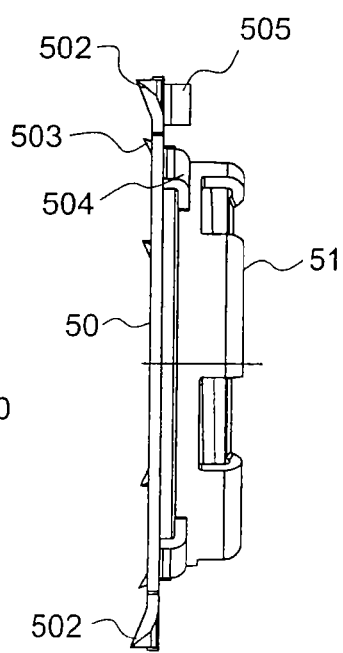
Figure 4:
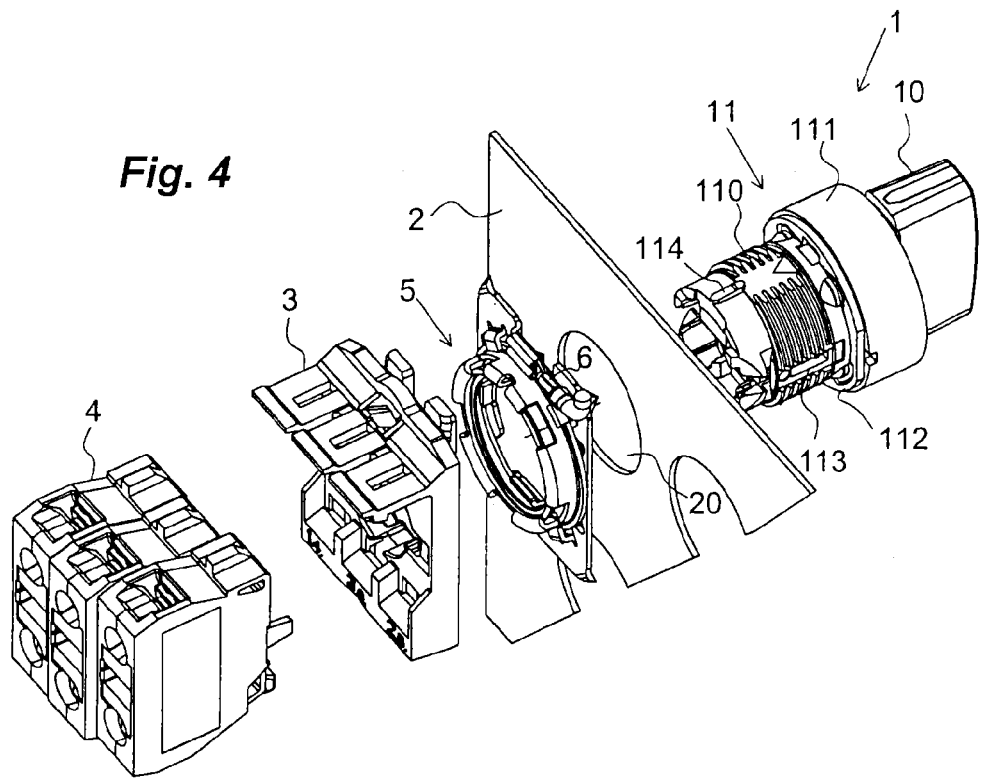
Figure 5:
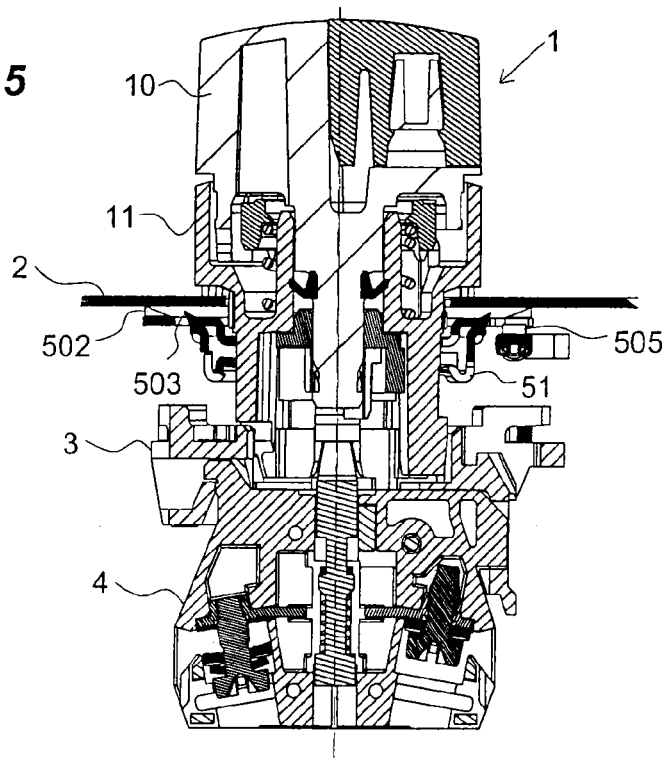
Figure 6:
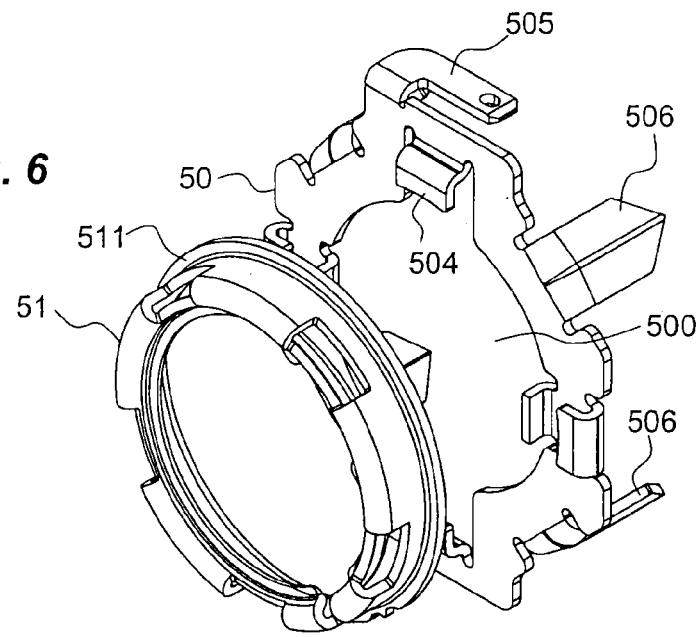
Figure 7:
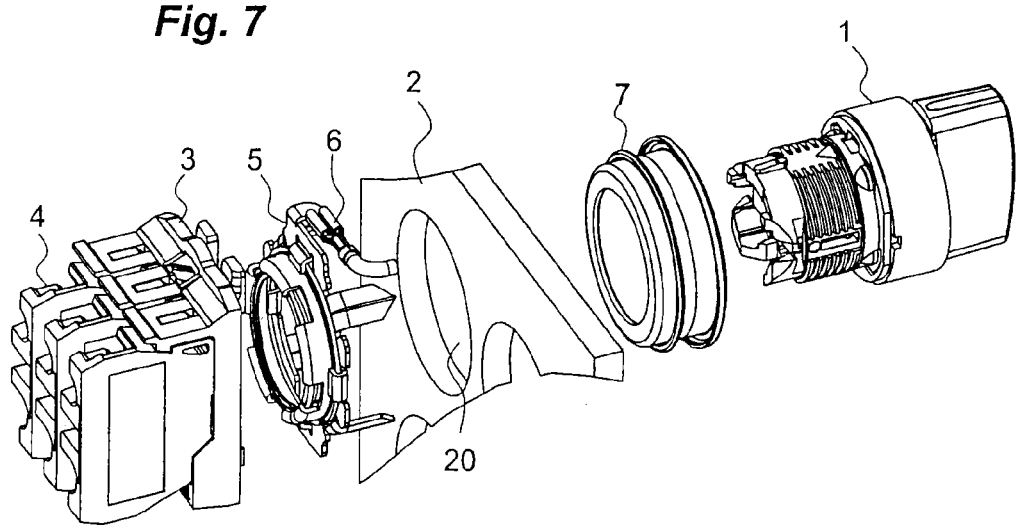
Figure 8:
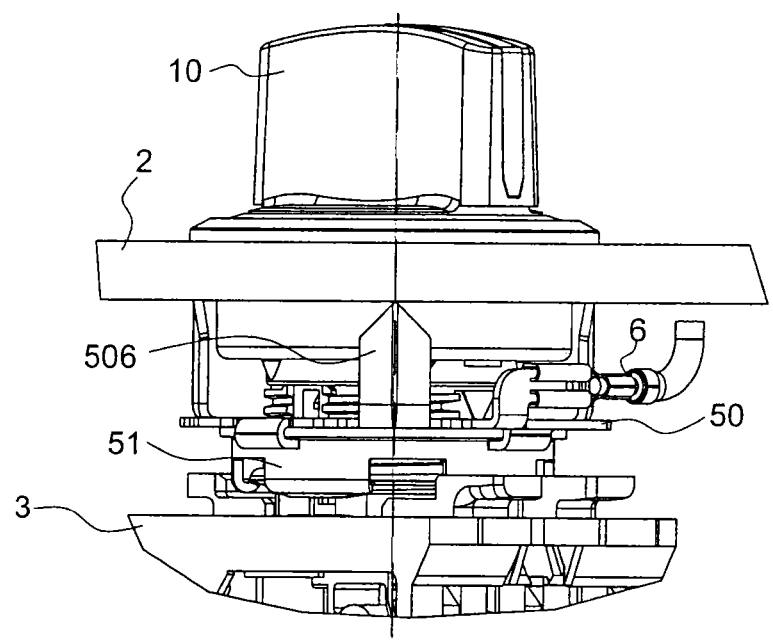

Other features and advantages will become apparent in the following detailed description of one embodiment given by way of example and with reference to the appended drawings, in which:

FIG. 1 is an exploded perspective view of the fixing device employed in the electric control or signaling device in accordance with the invention, FIGS. 2 and 3 respectively represent a top view and a side view of the fixing device in accordance with the invention when assembled, FIG. 4 is an exploded perspective view of a control device of the rotary knob type provided with the fixing device from FIGS. 1 to 3, FIG. 5 represents in longitudinal axial section the control device from FIG. 4 when assembled to a wall, FIG. 6 represents a variant embodiment of the fixing device in accordance with the invention used for flush mounting the control device, FIG. 7 is an exploded perspective view of a control device of the rotary knob type provided with the fixing device from FIG. 6, FIG. 8 is a side view of a detail of the control device from FIG. 7 assembled to a wall made of a plastic material, for example.

The invention concerns a control or signaling device, for example of the pushbutton, rotary knob or indicator lamp type intended to be engaged in an opening 20 formed through a metal wall 2, such as the door of an electrical equipment cabinet or a control console, for example. For a pushbutton or rotary knob, the opening 20 has a standard diameter of 22 mm or 25.5 mm, for example.

The remainder of the description and the drawings relate more particularly to a control device of the rotary knob type. However, it must be understood that the invention described hereinafter may be applied to any similar type of member having the same architecture.

Referring to FIGS. 4 and 5, a control device of the rotary knob type includes a tubular body 1 on which is mounted a rotary control member 10 and which is adapted to be engaged in the opening 20 formed through the wall 2. The tubular body 1 includes a cylindrical part 11 provided with a threaded portion 110 passing through the opening and a flange 111 forming with the cylindrical part 11 a shoulder 112 which in a so-called standard mounting comes to bear on a first face of the wall 2 around the opening 20. The control device also includes a fixing base 3 of rectangular shape, for example. This base 3 includes a central opening intended to have the cylindrical part 11 of the tubular body 1 pass through it and fixing means for removably supporting removable electrical assemblies 4 such as switch contact assemblies or auxiliary assemblies.

To fix the tubular body 1 to the wall 2, the control device includes a fixing device 5 that is applied against a second face of the wall 2, opposite the first face, to clamp the control device to the wall 2. This fixing device 5 includes a fixing plate 50 and a clamping ring 51 that screws onto the threaded portion 110 of the cylindrical part 11 of the body 1.

As is known, the tubular body 1 of the device may be made of metal or a plastic material. The remainder of the description relates to a control device which has a metal body 1.

Referring to FIGS. 1 to 3, the fixing plate 50 is made of metal and includes an opening 500 intended to be positioned coaxially with the opening 20 in the wall 2 to allow the cylindrical part 11 of the body 1 of the control device to pass through.

The fixing plate 50 also includes at the perimeter of its opening 500 guide means for guiding the body 1 into the opening 500 and adjusting its position relative to the plate 50. These guide means include lugs 501 intended to cooperate with a groove 113 formed on the cylindrical part 11 of the tubular body 1. These lugs 501 are sized to cooperate with a metal body 1 and to prevent a fixing device from being mounted on a plastic material body 1, to prevent all risk of damaging the plastic material body.

The fixing plate 50 is of rectangular shape for example and includes at each of its corners a projecting point 502 intended to come into contact with the second face of the wall 2. These projecting points 502 enable the plate and therefore the device to be turned to adjust its rotational position. These projecting points also, after final clamping up, enable immobilization of the device and prevent it from rotating when a user manipulates the rotary control member 10.

The fixing plate 50 includes a plurality of other projecting points 503 at the perimeter of its opening 500 intended to come into contact with the wall 2 to ground the fixing plate 50. Their projecting shape is designed to enable them, where appropriate, to perforate a layer of paint applied to the wall 2. The projecting points 502 come into contact with the panel first and enable the orientation of the fixing plate 50 to be visualized before complete clamping. As the body 1 is guided in the fixing plate 50 by the guide means formed by the lugs 501, the orientation of the fixing plate 50 enables the future orientation of the fixing base 3 and therefore of the electrical assemblies 4 fixed to the base 3 to be visualized. Positioning the fixing plate 50 vertically makes it certain that the fixing base 3 will be positioned vertically. The other projecting points 503 are for their part intended for grounding the device during clamping.

The cylindrical part 11 of the body 1 includes under the threaded portion 110 a lug 114 intended to cooperate with a corresponding slot 510 (FIG. 2) formed on the interior of the clamping ring 51. This slot 510 is present on a clamping ring made of metal but not on a clamping ring made of a plastic material. Accordingly, the presence of the lug 114 allows only the mounting of a metal clamping ring on a metal body and grounding of the metal device relative to the user. This lug 114 is also arranged on the body 1 of the device to prevent rotation of the clamping ring 51 when it is unscrewed.

In accordance with the invention, the fixing plate 50 includes retaining means for fastening the clamping ring to the fixing plate. These retaining means comprise a plurality of clips, for example four clips 504, formed at the perimeter of the opening 500 in the fixing plate 50 and applied to a circular exterior surface 511 of the clamping ring 51. These retaining means are adapted to immobilize the clamping ring 51 against movement in translation relative to the plate 50 but to leave the clamping ring 51 free to rotate about the axis of the opening.

The metal wall 2 being grounded, the mechanical connection between the fixing plate 50 and the clamping ring 51 enables direct grounding of the control device by connecting the tubular body 1 of the device to the metal wall 2 during clamping of the device to the metal wall. As a matter of fact, the tubular body 1 of the device being made of metal, it is connected to the metal clamping ring 51 when it is screwed on, the clamping ring 51 being connected to the fixing plate 50 via the clips 504 and the fixing plate 50 being connected to the metal wall via the projecting points 502.

In accordance with the invention, the clamping ring 51 may include clamping cut-outs 512 compatible with a clamping tool for screwing the clamping ring onto the threaded portion of the body of the device or unscrewing it therefrom.

In accordance with the invention, if the wall 2 is not made of metal, the device may be grounded by connecting a terminal 6 (FIG. 4) connected to ground to a terminal 505 on the fixing plate 50.

In a variant embodiment represented in FIGS. 6 to 8, the fixing plate 50 may be modified for flush mounting of the control device (FIG. 8). To this end, the projecting points 502, 503 are replaced by projecting teeth 506 upstanding in the direction of the wall 2 and coming into contact with the wall when screwing the clamping ring 51 onto the body of the device. These teeth 506 therefore extend over the distance that exists between the wall and the threaded portion of the body 1. If the wall is made of metal, these teeth 506 provide the ground connection between the wall 2 and the metal body 1 of the device. As described above, if the wall is made of plastic, a terminal 505 is also provided on the fixing plate 50 to receive a terminal 6 connected to ground. For flush mounting of the device, a seal 7 (FIG. 7) pushed into the opening 20 formed through the wall 2 may be provided to form a sealing barrier between the control member 10 and the electrical assemblies 4. In all other respects, the fixing device and its principle of operation remain identical to those described above in the case of a standard mounting.

It is to be clearly understood that, without departing from the scope of the invention, it is possible to conceive of other variants and improvements of detail and even to envisage the use of equivalent means.

The invention claimed is:

1. An electric control or signaling device configured to be assembled through an opening formed in a wall, and comprising:
   a tubular metal body configured to come to bear against a first face of the wall,
   the body including a threaded cylindrical part configured to be engaged in the opening and a fixing device including a metal clamping ring configured to be screwed onto the threaded cylindrical part of the body to fix the control or signal device through the opening,
   wherein the fixing device includes a metal fixing plate configured to be applied against a second face of the wall, opposite the first face, by action of the clamping ring, the fixing plate including an opening configured to have the body of the device pass through it and means for retaining the clamping ring enabling the clamping ring to be fastened to the fixing plate, the retaining means configured to prevent movement in translation of the clamping ring relative to the fixing plate and to leave the clamping ring free to rotate relative to the fixing plate.

2. The device as claimed in claim 1, wherein the fixing plate includes projecting points configured to come into contact with the second face of the wall.

3. The device as claimed in claim 1, wherein the fixing plate includes projecting teeth upstanding so as to come into contact with the wall and configured to provide flush mounting of the control or signaling device in the opening.

4. The device as claimed in claim 1, wherein the retaining means includes a plurality of clips distributed over a perimeter of the opening formed through the fixing plate.

5. The device as claimed in claim 1, wherein the fixing plate includes means for guiding the body of the control or signaling device.

6. The device as claimed in claim 1, wherein the cylindrical part of the body includes a lug configured to cooperate with a corresponding slot of the clamping ring.

7. The device as claimed in claim 1, wherein the fixing plate includes a connecting terminal configured to be connected to a terminal connected to a ground wire.

* * * * *